United States Patent
Lai et al.

(10) Patent No.: US 10,348,292 B1
(45) Date of Patent: Jul. 9, 2019

(54) POWER-ON RESET SIGNAL GENERATING APPARATUS AND VOLTAGE DETECTION CIRCUIT THEREOF

(71) Applicant: Winbond Electronics Corp., Taichung (TW)

(72) Inventors: Jyun-Yu Lai, Taichung (TW); Hsing-Yu Liu, Taichung (TW); Ya-Chun Chang, Taichung (TW)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 16/131,065

(22) Filed: Sep. 14, 2018

(51) Int. Cl.
*H03K 5/153* (2006.01)
*H03K 17/22* (2006.01)

(52) U.S. Cl.
CPC ................... *H03K 17/223* (2013.01)

(58) Field of Classification Search
CPC ........ H03K 5/2481; H03K 5/249; H03K 5/08; H03K 5/153; H03K 3/02337; H03K 3/0375; H03K 17/58; H03K 17/30; H03K 17/223; H03K 17/22; G01R 19/16519; G06F 1/24
See application file for complete search history.

(56) References Cited

U.S. PATENT DOCUMENTS

| | | | |
|---|---|---|---|
| 6,509,768 B2 | 1/2003 | Polizzi et al. | |
| 7,990,189 B2 * | 8/2011 | Shin | G11C 7/20 327/142 |
| 8,508,264 B1 | 8/2013 | Wang et al. | |
| 2011/0234203 A1 | 9/2011 | Chang et al. | |
| 2011/0234288 A1 * | 9/2011 | Lee | G05F 1/465 327/306 |

FOREIGN PATENT DOCUMENTS

| | | |
|---|---|---|
| CN | 102004183 | 4/2011 |
| TW | I531801 | 5/2016 |

* cited by examiner

*Primary Examiner* — Long Nguyen
(74) *Attorney, Agent, or Firm* — JCIPRNET

(57) ABSTRACT

A power-on reset signal generating apparatus and a voltage detection circuit thereof are provided. The voltage detection circuit includes a latch circuit, a pre-charge circuit, a pull-down switch and an output stage circuit. The pull-down circuit is turned on or cut off according to the power-on reset signal. The pre-charge circuit operates a pre-charge action according to a power-on reset signal or a power supply voltage. The output stage circuit receives the power supply voltage, based on the power supply voltage, generates a detection output voltage according to an input end of the inverter and the power-on reset signal.

12 Claims, 3 Drawing Sheets

POWER-ON RESET SIGNAL GENERATING APPARATUS AND VOLTAGE DETECTION CIRCUIT THEREOF

BACKGROUND OF THE INVENTION

Field of the Invention

The invention relates to a power-on reset signal generating apparatus and a voltage detection circuit thereof, and in particular, to a power-on reset signal generating apparatus and a voltage detection circuit thereof that can respond to different changes in the power supply voltage.

Description of Related Art

With the advancement of electronic technology, integrated circuit becomes an important core device of electronic devices. Wherein, Power On Reset (POR) circuit in integrated circuit, plays an important role. The POR circuit is configured to change the state of the power supply voltage, and generate a reset signal to enable resetting (initialization) action of logic circuits in the integrated circuit in the process of the power supply voltage being activated or restarted, to avoid the occurrence of malfunctions.

However, in the process of operating the electronic device, because of many different factors, cause a change in the power supply voltage. In a variety of possible variations in the power supply voltage, the POR circuit of the prior art is often not available in various states, that can effectively generate a POR signal, cause the integrated circuits to malfunction in unpredictable conditions.

SUMMARY OF THE INVENTION

The invention provides a voltage detection circuit which effectively detects the change state of the power supply voltage.

The invention further provides a power-on reset signal generating apparatus which applies the voltage detection circuit and generates a valid power-on reset signal in the different state of the power supply voltage.

The voltage detection circuit of the present invention includes a latch circuit, a pre-charge circuit, a pull-down switch, and an output stage circuit. The latch circuit has an inverter and an NOR gate circuit. The input end of the inverter is coupled to the output end of the NOR gate circuit. The output end of the inverter is coupled to the first input end of the NOR gate circuit, the second input end of the NOR gate circuit receives the reference ground voltage. The pre-charge circuit is coupled between the paths of the inverter receiving the power supply voltage, which executes pre-charging action based on a power-on reset signal or the power supply voltage. The pull-down switch is coupled between the output end of the inverter and the reference ground voltage, and to be turned on or off according to the power-on reset signal. The output stage circuit receives the power supply voltage, and detects the output voltage according to the voltage at the input end of the inverter and the power-on reset signal based on power supply voltage.

The power-on reset signal generating apparatus of the present invention includes the voltage detection circuit and the power-on reset circuit as described above. The power-on reset circuit is coupled to the voltage detection circuit through the voltage detection end. The power-on reset circuit includes a first reverse circuit, a second reverse circuit, a current collector, an output buffer, and a first capacitor. The first reverse circuit has an input end coupled to the voltage detection end to receive the detection output voltage, the output end of the first reverse circuit is coupled to the signal control end. The second reverse circuit has an input end coupled to the signal control end, a second reverse circuit having an output end coupled to the voltage detection end. The current collector is coupled to the voltage detection end, according to the power supply voltage and the voltage on the signal control end, the current is drawn from the voltage detection end. The output buffer is coupled to the signal control end, and according to the voltage on the signal control end to generate a voltage on reset signal. The first capacitor is coupled between the input end of the first reverse circuit and the power supply voltage.

Based on the above, the voltage detection circuit of the present invention performs a detecting action of a power supply voltage change state through an unbalanced latch circuit generated by an inverter, a NOR gate circuit, and to detect the output voltage accordingly. The power-on reset signal generating apparatus of the embodiment of the invention receives the detection output voltage, and different initialization actions are performed corresponding to different power supply voltage change states according to the detection output voltage. As a result, the power-on reset signal generating apparatus can effectively generate a power-on reset signal and maintain system stability.

In order to make the aforementioned and other features and advantages of the present invention more comprehensible, several embodiments accompanied with figures are described in detail below.

DESCRIPTION OF THE EMBODIMENTS

Figure 1:
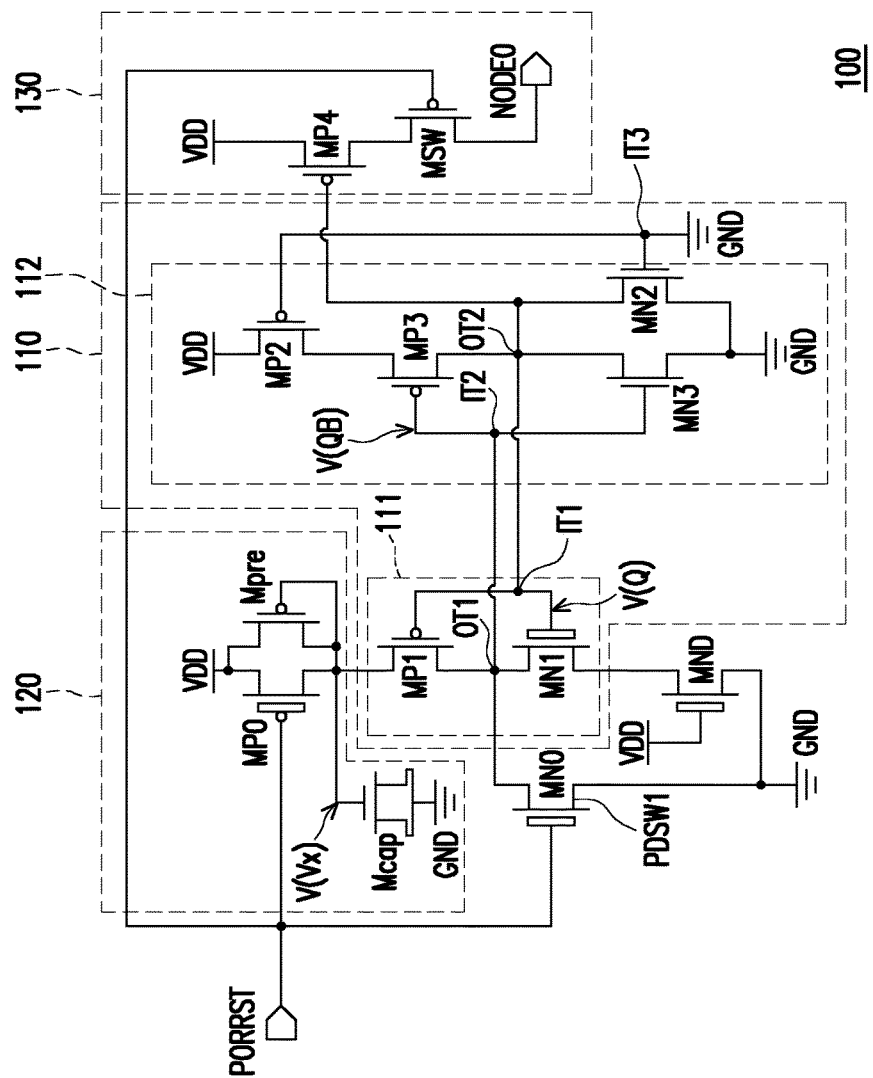
FIG. 1 is a schematic diagram of a voltage detection circuit according to an embodiment of the present invention.

Please refer to FIG. 1, FIG. 1 is a schematic diagram of a voltage detection circuit according to an embodiment of the present invention. The voltage detection circuit 100 includes a latch circuit 110, a pre-charge circuit 120, an output stage circuit 130, and a pull-down switch PDSW1. The latch circuit 110 has an inverter 111 and an NOR gate circuit 112, and forming an unbalanced latch circuit through the inverter 111 and the NOR gate circuit 112. The input end IT1 of the inverter 111 is coupled to the output end OT2 of the NOR gate circuit 112, the output end OT1 of the inverter 111 is coupled to the input end IT2 of the NOR gate circuit 112, the input end IT3 of the NOR gate circuit 112 receives the reference ground voltage GND.

In this embodiment, the pre-charge circuit 120 is coupled between the paths of the inverter 111 receiving the power supply voltage VDD. The pre-charge circuit 120 receives the power-on reset signal PORRST and performs a pre-charging action according to the power-on reset signal PORRST or according to the power supply voltage VDD. The pull-down switch PDSW1 is coupled between the output end OT1 of the inverter 111 and the reference ground voltage GND. The pull-down switch PDSW1 is turned on or off according to the power-on reset signal PORRST. With a mention, in FIG. 1, the voltage detection circuit 100 further includes a transistor MND. The transistor MND is coupled in series between the coupling path of the inverter 111 and the reference ground voltage GND, the transistor MND is an N-type transistor, and controlled by the power supply voltage VDD.

In this embodiment, the output stage circuit 130 is coupled to the input end IT1 of the inverter 111 (also coupled to the output end OT2 of the NOR gate circuit 112). The output stage circuit 130 receives the power supply voltage VDD, and generates a detection output voltage VNODE0 based on the power supply voltage VDD according to the voltage on the input end IT1 of the inverter 111 and the power-on reset signal PORRST. Wherein, the detection output voltage VNODE0 is configured to reflect the change state of the power supply voltage VDD, further explanation, the detection output voltage VNODE0 is configured to reflect the voltage drop and/or the rising speed when the power supply voltage VDD changes.

In detail, in this embodiment, pre-charge circuit 120 includes transistors MP0, Mpre, and capacitor Mcap. The first end of the transistor MP0 is coupled to the power supply voltage VDD, and the second end thereof is coupled to the first end of the inverter 111, the control end of the transistor MP0 receives the power-on reset signal PORRST and is turned on or off according to the power-on reset signal PORRST. The transistor Mpre is coupled with the transistor MP0 in parallel, the control end of the transistor Mpre is coupled to the first end of the inverter 111, and the transistor Mpre is configured as a diode. The capacitor Mcap is connected between the first end of the inverter 111 and the reference ground voltage GND in series, in this embodiment, the capacitor Mcap is a transistor capacitor. Worth taking note of, in other embodiments of the invention, the capacitor Mcap can also be implemented by other forms of capacitors, no specific restrictions.

On the other hand, the inverter 111 includes a transistor MP1 and an MN1. The transistor MP1 and the MN1 are coupled between the second end of the transistor MP0 and the first end of the transistor MND in series. The first end of the transistor MP1 is coupled to the pre-charge circuit 120, the second end of the transistor MP1 is coupled to the output end OT1 of the inverter 111, the control end of the transistor MP1 is coupled to the output end OT2 of the NOR gate circuit 112. The first end of the transistor MN1 is connected to the second end of the transistor MP1, the second end of the transistor MN1 is coupled to the reference ground voltage GND, and the control end of the transistor MN1 is coupled to the control end of the transistor MP1, and forming the input end IT1 of the inverter 111. In addition, the NOR circuit 112 includes transistors MP2, MP3, MN2, and MN3. The first end of the transistor MP2 receives the power supply voltage VDD, and the second end of the transistor MP2 is coupled to the first end of the transistor MP3. The second end of the transistor MP3 is coupled to the first end of the transistor MN3 and forms the output end OT2 of the NOR gate circuit 112, the second end of the transistor MN3 is coupled to the reference ground voltage GND. The first end of the transistor MN2 is coupled to the output end OT2 of the NOR gate circuit 112, the second end of the transistor MN2 is coupled to the reference ground voltage GND. And, the control ends of the transistors MP3 and MN3 are coupled to each other and form an input end IT2 of the NOR gate circuit 112, the control ends of the transistors MP2 and MN2 are coupled to each other, and forming another input end IT3 of the NOR gate circuit 112, wherein the input end IT3 receives reference ground voltage GND.

In addition, the pull-down switch PDSW1 is constructed by the transistor MN0, the first end of the transistor MN0 is coupled to the output end OT1 of the inverter 111, the second end of the transistor MN0 is coupled to the reference ground voltage GND, and the control end of the transistor MN0 receives the power-on reset signal PORRST.

In this embodiment, the output stage circuit 130 includes transistors MP4 and MSW. The first end of the transistor MP4 receives the power supply voltage VDD, and the second end of the transistor MP4 is coupled to the first end of the transistor MSW, the second end of the transistor MSW generates a detection output voltage VNODE0. The control ends of the transistors MP4 and MSW respectively receive the voltage on the output end OT2 of the NOR gate circuit 112 and the power-on reset signal PORRST. Worth mentioning, the configuration positions of the transistor MP4 and MSW can be exchanged, no specific restrictions.

Details of the action of the voltage detection circuit 100, when the power supply voltage VDD of the voltage detection circuit 100 is activated, power supply voltage VDD rises with time, the power-on reset signal PORRST tracks the power supply voltage VDD gradually rising. When the voltage value of the power-on reset signal PORRST rises to a certain level, the pull-down switch PDSW is turned on, and the voltage V(QB) on the output end of the inverter 111 is discharged to the reference ground voltage GND. In the meantime, recharge effect through the transistor Mpre, the voltage V(Vx) of the capacitor Mcap coupled to the end of the transistor Mpre is charged to be equal to the power supply voltage VDD minus the threshold voltage Vt of the transistor Mpre.

On the other hand, decrease in voltage V(QB) at the output end of the corresponding inverter 111, the transistor MP3 is turned on (the transistor MN3 is turned off), the voltage V(Q) on the output end OT2 of the NOR gate circuit 112 is pulled up to be equal to the power supply voltage VDD. And make the transistor MP4 disconnected, making the detection output voltage VNODE0 appear in a high impedance state.

In addition, after the start of the power supply voltage VDD, the voltage value of the power supply voltage VDD reaches a stable voltage level Vdd', at this time, the power-on reset signal PORRST is switched to the low voltage level, and make the transistor MP0 turned on. Corresponding to this, the voltage V(Vx) on the capacitor Mcap is charged to the stable voltage level Vdd' of the power supply voltage VDD.

Continuing the above embodiment, when the power supply voltage VDD changes again suddenly (for example, drops to the voltage Vlow), based on the voltage V(Vx) on the capacitor Mcap (equal to the voltage level Vdd') being higher than the voltage Vlow, the transistor MP1 can be turned on and charged to the output OT1 of the inverter 111 to pull up the voltage V (QB) voltage value. Then the transistor MN3 is turned on (the transistor MP3 is turned off), and discharging the output end OT2 of the NOR circuit 112, pull down the voltage value of voltage V(Q).

Corresponding to the pulled down state of voltage V(Q), transistor MP4 is turned on, at the same time, based on the low voltage level of the power-on reset signal PORRST, and the transistor MSW is turned on synchronously, and causing the output stage circuit 130 to generate a detection output voltage VNODE0 which is equal to the power supply voltage VDD.

It can be known from the above description, through the voltage pre-stored the capacitor Mcap, when the power supply voltage VDD changes, the inverter 111 can react quickly and cooperate with the NOR circuit 112, switching is performed by the voltage levels of the voltages V(Q) and V(QB) on the output ends OT1 and OT2, and triggering the output stage circuit 130 to generate a corresponding detection output voltage VNODE0.

Figure 2:
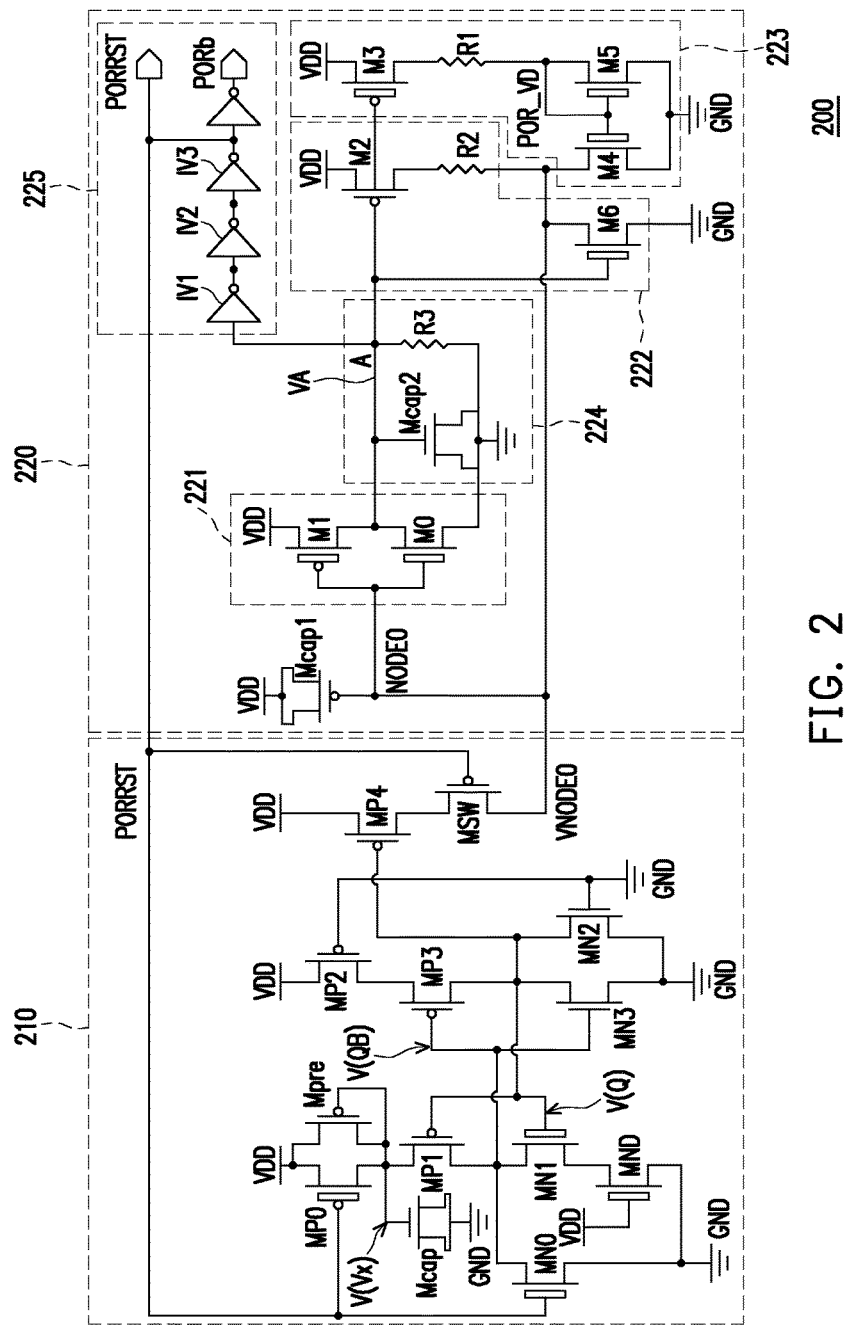
FIG. 2 is a schematic diagram of a power-on reset signal generating apparatus according to an embodiment of the present invention.

Please refer to FIG. 2 below, FIG. 2 is a schematic diagram of a power-on reset signal generating apparatus according to an embodiment of the invention. The power-on reset signal generating apparatus 200 includes a voltage detection circuit 210 and a power-on reset circuit 220. The power-on reset circuit 220 is coupled to the voltage detection circuit 210, which receives the detection output voltage VNODE0 generated by the voltage detection circuit 210 through the voltage detection end NODE0.

Implementation details of the voltage detection circuit 210, which is similar to the aforementioned voltage detection circuit 100, so it is omitted hereinafter.

In this embodiment, the power-on reset circuit 220 includes a reverse circuit 221, 222, a current collector 223, an output buffer 225, and a capacitor Mcap1. The reverse circuit 221 has an input end coupled to the voltage detection end NODE0 to receive the detection output voltage VNODE0. The output end of the reverse circuit 221 is coupled to the signal control end A. The reverse circuit 222 has an input end coupled to the signal control end A, and a reverse circuit 222 having an output end coupled to the voltage detection end NODE0. The current collector 223 is coupled to the voltage detection end NODE0, according to the power supply voltage VDD and the voltage on the signal control end A, the current is drawn by the voltage detection end NODE0. The output buffer 225 is coupled to the signal control end A, which generates power-on reset signals PORRST and PORb according to voltage of the signal control end A, wherein the power-on reset signal PORRST and the power-on reset signal PORb are mutually reverse signal. The capacitor Mcap1 is coupled between the input end of the reverse circuit 221 and the power supply voltage VDD.

In this embodiment, the power-on reset circuit 220 further includes a resistor-capacitor circuit 224. The RC circuit 224 has a resistor R3 and a capacitor Mcap2 connected in parallel with each other. The resistor R3 and the capacitor Mcap2 are coupled between the signal control end A and the reference ground voltage GND. Wherein, when the detection output voltage VNODE0 provided by the voltage detection circuit 210 is in a high impedance state, the resistor R3 and capacitor Mcap2 can be initialized for the voltage on the signal control end A, and discharge action is performed through the resistor R3 to pull down the voltage on the signal control end A.

The reverse circuit 221 includes transistors M1, M0, the transistors M1 and M0 are connected between the power supply voltage VDD and the reference ground voltage GND in series. The control ends of the transistors M1 and M0 are coupled to the voltage detection end NODE0, the output end of the reverse circuit 221 is coupled to the signal control end A. The reverse circuit 222 includes transistors M2, M6 and a resistor R2. The transistor M2, the resistor R2, and the transistor M6 are sequentially connected between the power supply voltage VDD and the reference ground voltage GND in series. The control ends of the transistor M2 and the transistor M6 are coupled to the signal control end A, and the output end of the inverter circuit 222 is coupled to the voltage detection end NODE0.

On the other hand, the current collector 223 includes transistors M3 to M5 and a resistor R1, the transistors M4 and M5 are coupled into a current mirror type, the transistor M3 and the resistor R1 are sequentially coupled between the power supply voltage VDD and the transistor M5. The control end of the transistor M3 receives the voltage on the signal control end A and generates current according to the voltage on the signal control end A.

Details of the action of the power-on reset signal generating apparatus 200, in the process of the power supply voltage VDD being turned on, the voltage VA on the signal control end A and the voltage detection end NODE0 and the detection output voltage VNODE0 rise as the power supply voltage VDD rises. Simultaneously, the output buffer 225 can generate a power-on reset signal PORRST that rises as the power supply voltage VDD rises through the plurality of inverters IV1 to IV3 connected in series. And, when the detection output voltage VNODE0 is raised to be greater than the threshold voltage of the reverse circuit 221, the voltage VA on the signal control end A is pulled low.

Corresponding to the pull-down action of the voltage VA, power-on reset signal PORRST is pulled high to high voltage level. Simultaneously, the current collector 223 also generates the bias voltage POR_VD according to the voltage VA of the low voltage, and rises with the bias voltage POR_VD, transistor M4 provides the ability to draw current from voltage sense terminal NODE0, and the detection output voltage VNODE0 on the voltage detection end NODE0 is rapidly decreased.

As the detection output voltage VNODE0 drops, the inverter circuit 221 can pull up the voltage VA on the signal control end A, simultaneously, the output buffer 225 can reduce the power-on reset signal PORRST to a low voltage level according to the pull-up voltage.

After the voltage level of the power supply voltage VDD is stabilized, when the state occurs in which the power supply voltage VDD drops again, please refer to FIG. 2 and FIG. 3 at the same time, FIG. 3 is a diagram showing the action waveforms of the power-on reset signal generating apparatus according to the embodiment of the present invention. Wherein, the power supply voltage VDD generates a rapidly falling state in the time interval Tf1, and when it falls to the dead zone, the voltage detection circuit 210 can generate a switching state by making the voltage levels of the voltages V(Q) and V(QB), and generate the detection output voltage VNODE0 equal to the high voltage level according to the voltage V(Q) whose transition state is the low voltage level. And the power-on reset circuit 220 is initialized by the detection output voltage VNODE0.

Then, the power supply voltage VDD is maintained at a low voltage level in the time interval Tk1, and rise to a stable voltage level in the subsequent time interval Tf2. In the meantime, the detection output voltage VNODE0 is pulled down again, and the power-on reset circuit 220 can regenerate the power-on reset signal PORRST in the high voltage level.

Figure 3:
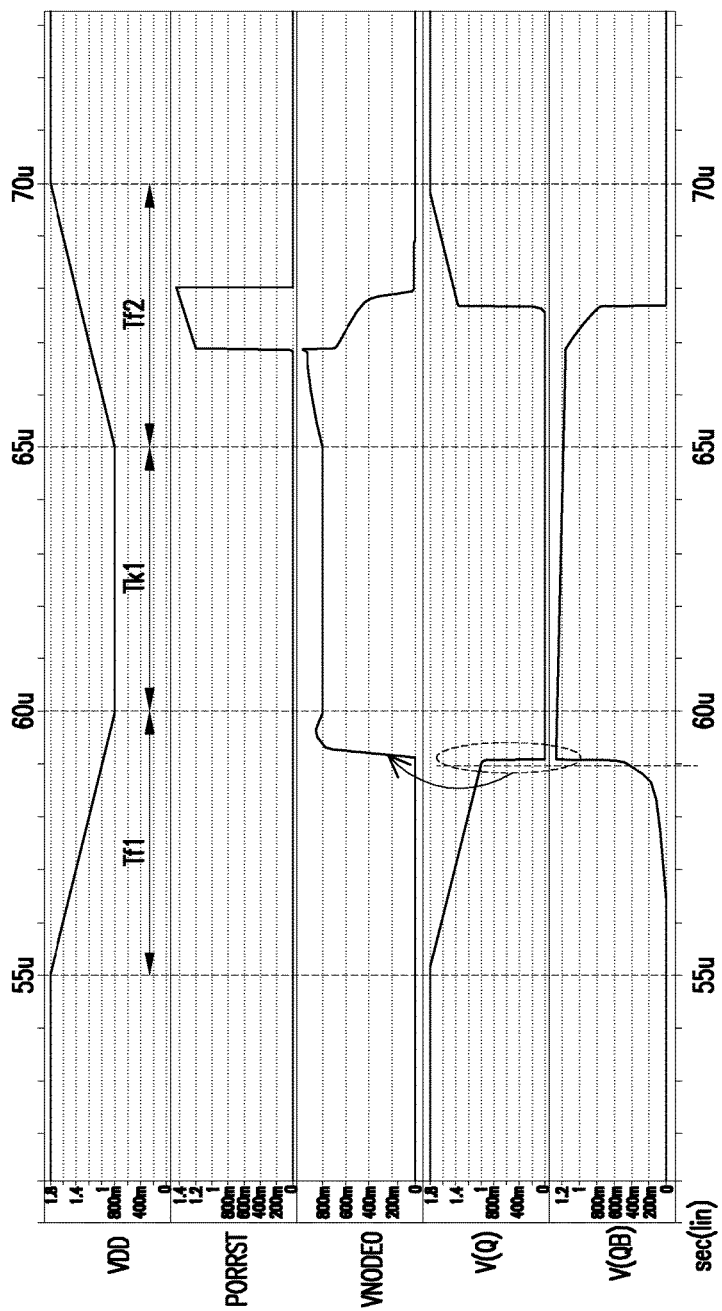
FIG. 3 is a diagram showing an action waveform of a power-on reset signal generating apparatus according to an embodiment of the present invention.

It can be known from the depiction of FIG. 3, in this embodiment, in the time interval Tf1, when the power supply voltage VDD is rapidly falling, the detection output voltage VNODE0 can be quickly pulled high before the time interval Tf1 is not over. Therefore, whether the length of the time interval Tk1 is enough, when entering the time interval Tf2, the power-on reset circuit 220 can generate an effective power-on reset signal PORRST to maintain normal operation of the system. In addition, in the condition that the power supply voltage VDD drops too slowly, the change of the voltage on the capacitor Mcap and the power supply voltage VDD are independent, the voltage detection circuit 210 of the embodiment of the present invention can still effectively switch the voltage levels of the voltages V(Q) and V(QB), and causing power-on reset circuit 220 to generate a valid power-on reset signal PORRST.

In summary, the invention provides a voltage detection circuit for detecting a change state of a power supply voltage. And by setting a non-balanced latch circuit, and detecting the output voltage by changing the voltage state in the latch circuit when the power supply voltage changes state. In the embodiment of the invention, the voltage detection circuit provides a detection output voltage to initialize the power-on reset circuit, to make it generate a valid power-on reset signal.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A voltage detection circuit configured to detect the change state of a power supply voltage, comprising:
   a latch circuit, having an inverter and an NOR gate circuit, an input end of the inverter is coupled to an output end of the NOR gate circuit, an output end of the inverter is coupled to a first input end of the NOR gate circuit, a second input end of the NOR gate circuit receives a reference ground voltage;
   a pre-charge circuit, coupled between paths where the inverter receives the power supply voltage, the pre-charge circuit performing a pre-charging action according to power-on reset signal or the power supply voltage;
   a pull-down switch, coupled between an output end of the inverter and the reference ground voltage, the pull-down switch is be turned on or off according to the power-on reset signal; and
   an output stage circuit, receiving the power supply voltage, based on the power supply voltage, the output stage generating a detection output voltage according to the voltage at the input end of the inverter and the power-on reset signal.

2. The voltage detection circuit according to claim 1, wherein the pre-charge circuit includes:
   a first transistor, coupled between the power supply voltage and the first end of the inverter, the first transistor is turned on or off according to the power-on the reset signal;
   a diode, an anode of the diode receives the power supply voltage, a cathode of the diode is coupled to the first end of the inverter;
   a capacitor, coupled between the first end of the inverter and the reference ground voltage,
   wherein the first end of the inverter is configured to receive the power supply voltage.

3. The voltage detection circuit according to claim 2, wherein the diode is a second transistor, the first end of the second transistor receives the power supply voltage, the second end of the second transistor is coupled to the control end of the second transistor and the first end of the inverter, the second transistor is a P-type transistor.

4. The voltage detection circuit according to claim 2, wherein the pull-down switch includes:
   a second transistor, the first end of the second transistor is coupled to the output end of the inverter, the second end of the second transistor is coupled to the reference ground voltage, the second transistor receives the power-on reset signal.

5. The voltage detection circuit according to claim 1, wherein the inverter includes:
   a first transistor, the first end of the first transistor is connected to the pre-charge circuit, the second end of the first transistor is coupled to the output end of the inverter, the control end of the first transistor is coupled to the output end of the NOR gate circuit; and
   a second transistor, the first end of the second transistor is connected to the second end of the first transistor, the second end of the second transistor is coupled to the reference ground voltage, the control end of the second transistor is coupled to the control end of the first transistor.

6. The voltage detection circuit according to claim 5, further includes:
   a third transistor, coupled between the paths of the second transistor which is coupled to the reference ground voltage, the control end of the third transistor receives the power supply voltage.

7. The voltage detection circuit according to claim 1, wherein the NOR gate circuit includes:
   a first transistor, a first end of the first transistor receives the power supply voltage, a control end of the first transistor is a second input end of the NOR gate circuit;
   a second transistor, a first end of the second transistor is coupled to the second end of the first transistor, a second end of the second transistor is coupled to the input end of the inverter, a control end of the second transistor is coupled to the output end of the inverter;
   a third transistor, a first end of the third transistor is coupled to the second end of the second transistor, a second end of the third transistor is coupled to the reference ground voltage, a control end of the third transistor is coupled to the control end of the second transistor; and
   a fourth transistor, a first end of the fourth transistor is coupled to the second end of the second transistor, a second end of the fourth transistor is coupled to the reference ground voltage, a control end of the fourth transistor is coupled to the reference ground voltage.

8. The voltage detection circuit according to claim 1, wherein the output stage circuit includes:
   a first transistor, a first end of the first transistor receives the power supply voltage, a control end of the first transistor is coupled to the output end of the NOR gate circuit; and
   a second transistor, a first end of the second transistor is coupled to the second end of the first transistor, a second end of the second transistor generates the detection output voltage, a control end of the second transistor receives the power-on reset signal.

9. A power-on reset signal generating apparatus, comprising:
   a voltage detection circuit as claimed in claim 1; and
   a power-on reset circuit, coupled to the voltage detection circuit through a voltage detection end, includes:
   a first reverse circuit, an input end of the first reverse circuit is coupled to the voltage detection end to receive the detection output voltage, an output end of the first reverse circuit is coupled to a signal control end;
   a second reverse circuit, an input end of the second reverse circuit is coupled to the signal control end, the second reverse circuit has an output end coupled to the voltage detection end;

a current collector, coupled to the voltage detection end, the current collector retrieves current from the voltage detection end according to the power supply voltage and the voltage on the signal control end;

an output buffer, coupled to the signal control end, the output buffer generating the power-on reset signal according to the voltage on the signal control end; and a capacitor, coupled between the input end of the first reverse circuit and the power supply voltage.

10. The power-on reset signal generating apparatus according to claim 9, wherein the power-on reset circuit further includes:

a resistor capacitor circuit, having a resistor and a capacitor connected in parallel with each other, the resistor capacitor circuit is coupled between the signal control end and the reference ground voltage.

11. The power-on reset signal generating apparatus according to claim 9, wherein the current collector includes:

a first transistor, a first end of the first transistor receives the power supply voltage, the control end of the first transistor is coupled to the signal control end;

a second transistor, a first end and the control end of the second transistor are coupled to the second end of the second transistor, a second end of the second transistor is coupled to the reference ground voltage; and a third transistor, a first end of the third transistor is coupled to the second end of the first transistor, a control end of the third transistor is coupled to the control end of the second transistor, a second end of the third transistor is coupled to the reference ground voltage.

12. The power-on reset signal generating apparatus according to claim 9, wherein the output buffer includes at least one inverter, an input end of the at least one inverter is coupled to the signal control end, an output end of the at least one inverter generates the power-on reset signal.

* * * * *